(12) United States Patent
Gong (10) Patent No.: US 11,751,469 B2
(45) Date of Patent: Sep. 5, 2023

(54) OLED DISPLAY PANEL, MANUFACTURING METHOD THEREOF, AND OLED DISPLAY DEVICE

(71) Applicant: Wuhan China Star Optoelectronics Semiconductor Display Technology Co., Ltd., Wuhan (CN)

(72) Inventor: Jixiang Gong, Wuhan (CN)

(73) Assignee: Wuhan China Star Optoelectronics Semiconductor Display Technology Co., Ltd., Wuhan (CN)

(*) Notice: Subject to any disclaimer, the term of this patent is extended or adjusted under 35 U.S.C. 154(b) by 615 days.

(21) Appl. No.: 16/957,387

(22) PCT Filed: Apr. 3, 2020

(86) PCT No.: PCT/CN2020/083214
§ 371 (c)(1),
(2) Date: Jun. 24, 2020

(87) PCT Pub. No.: WO2021/189524
PCT Pub. Date: Sep. 30, 2021

(65) Prior Publication Data
US 2023/0006156 A1 Jan. 5, 2023

(30) Foreign Application Priority Data
Mar. 23, 2020 (CN) .......................... 202010209272.8

(51) Int. Cl.
*H10K 77/10* (2023.01)
*H10K 71/00* (2023.01)
(Continued)

(52) U.S. Cl.
CPC ............. *H10K 77/10* (2023.02); *H10K 71/00* (2023.02); *H10K 59/12* (2023.02); *H10K 59/1201* (2023.02); *H10K 2102/311* (2023.02)

(58) Field of Classification Search
None
See application file for complete search history.

(56) References Cited

U.S. PATENT DOCUMENTS

2019/0205596 A1  7/2019  Kim et al.
2020/0312926 A1* 10/2020  Bae .................... H01L 27/3234
(Continued)

FOREIGN PATENT DOCUMENTS

CN  107359185  11/2017
CN  107945683   4/2018
(Continued)

OTHER PUBLICATIONS

Machine translation of CN 107946348 (Year: 2018).*
(Continued)

*Primary Examiner* — Joe E. Schoenholtz
(74) *Attorney, Agent, or Firm* — PV IP PC; Wei Te Chung; Zhigang Ma (57) ABSTRACT

An organic light-emitting diode (OLED) display panel, a manufacturing method thereof, and an OLED display device are provided. At least one of a substrate or a backplate in the OLED display panel has a reduced thickness, thereby increasing light transmittance of an electronic element area. Furthermore, an area where a camera lens is disposed can display normally and an under-display camera can be realized without defining a hole. Therefore, a screen-to-body ratio is increased, and a technical problem is solved: in conventional OLED display panels, the hole needs to be defined on the area where the camera lens is disposed, leading to a display effect being affected.

20 Claims, 5 Drawing Sheets

(51) Int. Cl.
  *H10K 59/12* (2023.01)
  *H10K 102/00* (2023.01)

(56) References Cited

U.S. PATENT DOCUMENTS

| | | | | |
|---|---|---|---|---|
| 2021/0028252 | A1* | 1/2021 | Hong | H01L 27/3234 |
| 2021/0174111 | A1* | 6/2021 | Im | H04M 1/026 |
| 2021/0176872 | A1* | 6/2021 | Woo | H05K 5/0017 |
| 2021/0202868 | A1* | 7/2021 | Paek | H01L 51/0097 |

FOREIGN PATENT DOCUMENTS

| | | | |
|---|---|---|---|
| CN | 107946341 | | 4/2018 |
| CN | 107946341 A | * 4/2018 | ......... H01L 27/3227 |
| CN | 209045560 | | 6/2019 |
| CN | 110190097 | | 8/2019 |
| CN | 110211972 | | 9/2019 |
| CN | 110212005 | | 9/2019 |
| CN | 110544433 | | 12/2019 |
| CN | 110600516 | | 12/2019 |
| CN | 110610966 | | 12/2019 |
| CN | 110729335 | | 1/2020 |
| JP | 11-223838 | | 8/1999 |
| JP | 2005-251954 | | 9/2005 |
| WO | WO 2011/083551 | | 7/2011 |

OTHER PUBLICATIONS

Ayers "Digital Integrated Circuits Analysis and Design", 2nd Ed., p. 65, Mar. 31, 2013.
Feng "Dictionary of Solid State Physics", p. 1110, Feb. 28, 1995.

* cited by examiner

OLED DISPLAY PANEL, MANUFACTURING METHOD THEREOF, AND OLED DISPLAY DEVICE

RELATED APPLICATIONS

This application is a National Phase of PCT Patent Application No. PCT/CN2020/083214 having International filing date of Apr. 3, 2020, which claims the benefit of priority of Chinese Patent Application No. 202010209272.8 filed on Mar. 23, 2020. The contents of the above applications are all incorporated by reference as if fully set forth herein in their entirety.

FIELD AND BACKGROUND OF THE INVENTION

The present disclosure relates to the field of display technologies, and more particularly, relates to an organic light-emitting diode (OLED) display panel, a manufacturing method thereof, and an OLED display device.

Traditionally, a camera lens is disposed below a display panel to increase a screen-to-body ratio of organic light-emitting diode (OLED) display panels. However, in doing so, an area where the camera lens is disposed needs to be cut to form an irregular shape (a hole) because light is blocked by the display panel before entering the camera lens. The hole area cannot display and affects display effect.

Therefore, in conventional OLED display panels, a hole needs to be defined on an area where a camera lens is disposed, leading to a display effect being affected.

SUMMARY OF THE INVENTION

Embodiments of the present disclosure provides an OLED display panel, a manufacturing method thereof, and an OLED display device to solve a technical problem: in conventional OLED display panels, a hole needs to be defined on an area where a camera lens is disposed, leading to a display effect being affected.

To solve the above problem, technical solutions provided by the present disclosure are described as follows.

An embodiment of the present disclosure provides an OLED display panel, including: a backplate; a substrate disposed on the backplate; a driving circuit layer disposed on the substrate; a light-emitting functional layer disposed on the driving circuit layer; and an encapsulation layer disposed on the light-emitting functional layer. A total thickness of the backplate and the substrate in an electronic element area where a plurality of electronic elements are disposed is less than a total thickness of the backplate and the substrate in other areas.

In some embodiments, the driving circuit layer includes an active layer, and a mass fraction of phosphorus in the active layer in the electronic element area is greater than a mass fraction of phosphorus in the active layer in other areas.

In some embodiments, the OLED display panel includes a plurality of pixel units, and a density of the pixel units in the electronic element area is less than a density of the pixel units in other areas.

In some embodiments, a thickness of the backplate in the electronic element area is less than a thickness of the backplate in other areas, and a thickness of the substrate in the electronic element area is equal to a thickness of the substrate in other areas.

In some embodiments, a thickness of the substrate in the electronic element area is less than a thickness of the substrate in other areas, and a thickness of the backplate in the electronic element area is equal to a thickness of the backplate in other areas.

In some embodiments, a thickness of the backplate in the electronic element area is less than a thickness of the backplate in other areas, and a thickness of the substrate in the electronic element area is less than a thickness of the substrate in other areas.

In some embodiments, the substrate includes a first flexible layer, a barrier layer, and a second flexible layer, and a thickness of the first flexible layer in the electronic element area is less than a thickness of the first flexible layer in other areas.

In some embodiments, an adhesive layer is disposed between the first flexible layer and the backplate, and a thickness of the adhesive layer in the electronic element area is less than a thickness of the adhesive layer in other areas.

In some embodiments, the thickness of the backplate in the electronic element area is 0.

In some embodiments, the thickness of the adhesive layer in the electronic element area is 0.

Furthermore, an embodiment of the present disclosure provides an OLED display device, including: an OLED display panel, wherein the OLED display panel includes a backplate, a substrate, a driving circuit layer, a light-emitting functional layer, and an encapsulation layer, the substrate is disposed on the backplate, the driving circuit layer is disposed on the substrate, the light-emitting functional layer is disposed on the driving circuit layer, the encapsulation layer is disposed on the light-emitting functional layer, and a total thickness of the backplate and the substrate in an electronic element area where a plurality of electronic elements are disposed is less than a total thickness of the backplate and the substrate in other areas; and a plurality of electronic elements disposed in the electronic element area.

In some embodiments, the electronic elements include a camera lens.

In some embodiments, the driving circuit layer includes an active layer, and a mass fraction of phosphorus in the active layer in the electronic element area is greater than a mass fraction of phosphorus in the active layer in other areas.

In some embodiments, the OLED display panel includes a plurality of pixel units, and a density of the pixel units in the electronic element area is less than a density of the pixel units in other areas.

In some embodiments, a thickness of the backplate in the electronic element area is less than a thickness of the backplate in other areas, and a thickness of the substrate in the electronic element area is equal to a thickness of the substrate in other areas.

In some embodiments, a thickness of the substrate in the electronic element area is less than a thickness of the substrate in other areas, and a thickness of the backplate in the electronic element area is equal to a thickness of the backplate in other areas.

In some embodiments, a thickness of the backplate in the electronic element area is less than a thickness of the backplate in other areas, and a thickness of the substrate in the electronic element area is equal to a thickness of the substrate in other areas.

In some embodiments, the substrate includes a first flexible layer, a barrier layer, and a second flexible layer, and a thickness of the first flexible layer in the electronic element area is less than a thickness of the first flexible layer in other areas.

In some embodiments, an adhesive layer is disposed between the first flexible layer and the backplate, and a thickness of the adhesive layer in the electronic element area is less than a thickness of the adhesive layer in other areas.

Furthermore, an embodiment of the present disclosure provides a method of manufacturing an OLED display panel, including following steps: providing a backplate; forming a substrate on the backplate, wherein the substrate includes a first flexible layer, a second flexible layer, and a barrier layer disposed between the first flexible layer and the second flexible layer; forming a driving circuit layer on the substrate, and doping phosphorus into a channel area of an active layer in the driving circuit layer in an electronic element area where a plurality of electronic elements are disposed; forming a light-emitting functional layer on the driving circuit layer; forming an encapsulation layer on the light-emitting functional layer; and removing the backplate and the first flexible layer in the electronic element area to obtain a display panel, wherein a total thickness of the backplate and the substrate in the electronic element area is less than a total thickness of the backplate and the substrate in other areas.

Regarding the beneficial effects: embodiments of the present disclosure provide an OLED display panel, a manufacturing method thereof, and an OLED display device. The OLED display panel includes a backplate, a substrate, a driving circuit layer, a light-emitting functional layer, and an encapsulation layer. The substrate is disposed on the backplate, the driving circuit layer is disposed on the substrate, the light-emitting functional layer is disposed on the driving circuit layer, and the encapsulation layer is disposed on the light-emitting functional layer. A total thickness of the backplate and the substrate in an electronic element area where the plurality of electronic elements are disposed is less than a total thickness of the backplate and the substrate in other areas. In the present disclosure, at least one of the substrate or the backplate in the electronic element area has a reduced thickness, thereby increasing light transmittance of the electronic element area. Furthermore, it is not necessary to define a hole to realize an under-display camera lens, so that an area where the camera lens is disposed can display normally, and a screen-to-body ratio is increased. As a result, a technical problem is solved: in conventional OLED display panels, a hole needs to be defined on an area where a camera lens is disposed, leading to a display effect being affected.

DESCRIPTION OF SPECIFIC EMBODIMENTS OF THE INVENTION

Embodiments are further described below in detail with reference to accompanying drawings to make objectives, technical solutions, and effects of the present disclosure clearer and more precise. It should be noted that described embodiments are merely used to construct the present disclosure and are not intended to limit the present disclosure.

An embodiment of the present disclosure solves a technical problem: in conventional OLED display panels, a hole needs to be defined on an area where a camera lens is disposed, leading to a display effect being affected.

Figure 1:
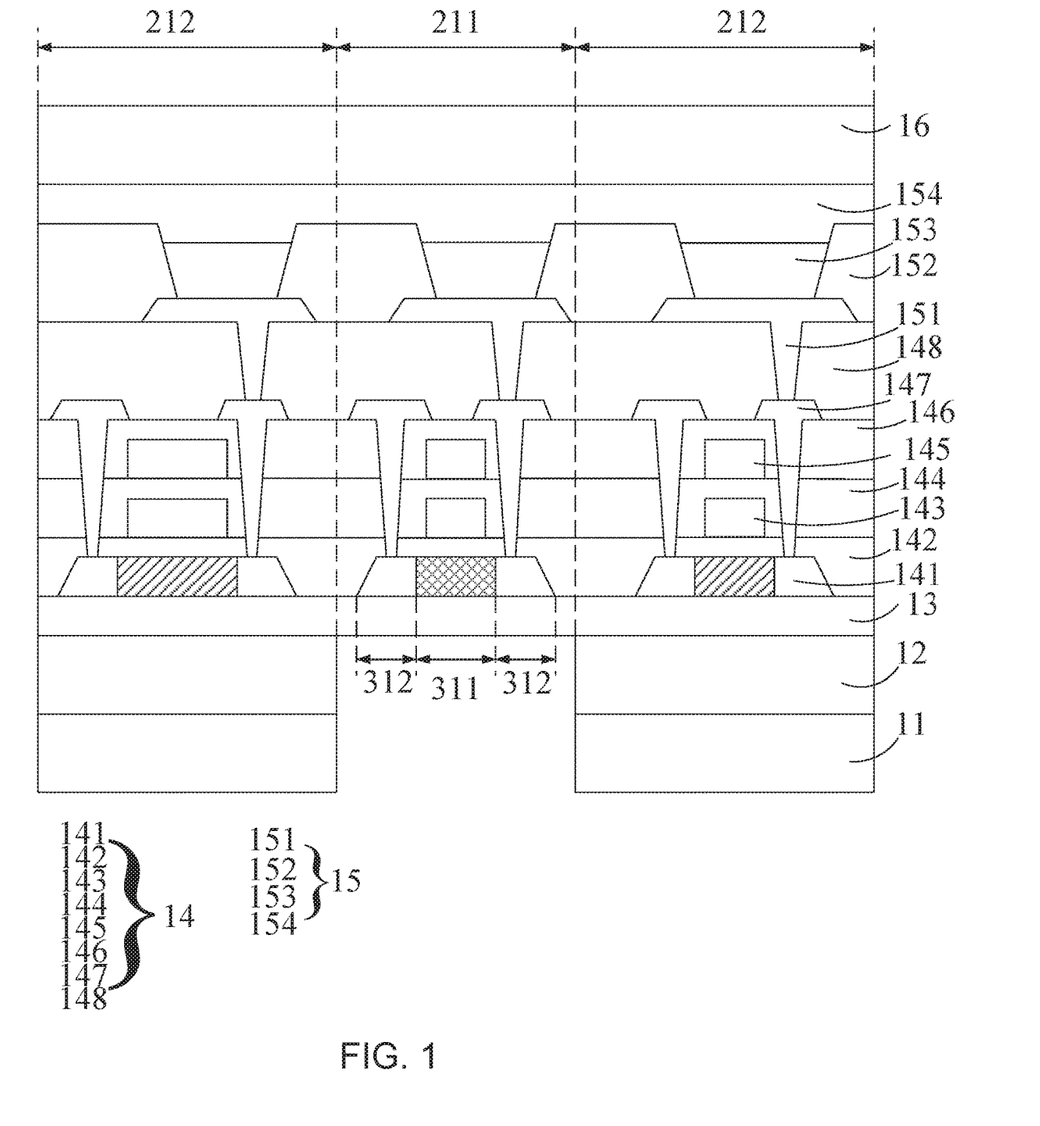
FIG. 1 is a first schematic view showing an OLED display panel provided by an embodiment of the present disclosure.

As shown in FIG. 1, an embodiment of the present disclosure provides an OLED display panel, including: a backplate 11; a substrate 12 disposed on the backplate 11; a driving circuit layer 14 disposed on the substrate 12; a light-emitting functional layer 15 disposed on the driving circuit layer 14; and an encapsulation layer 16 disposed on the light-emitting functional layer 15.

A total thickness of the backplate 11 and the substrate 12 in an electronic element area 211 where a plurality of electronic elements are disposed is less than a total thickness of the backplate 11 and the substrate 12 in other areas.

An embodiment of the present disclosure provides an OLED display panel including a backplate, a substrate, a driving circuit layer, a light-emitting functional layer, and an encapsulation layer. The substrate is disposed on the backplate, the driving circuit layer is disposed on the substrate, the light-emitting functional layer is disposed on the driving circuit layer, and the encapsulation layer is disposed on the light-emitting functional layer. A total thickness of the backplate and the substrate in an electronic element area where a plurality of electronic elements are disposed is less than a total thickness of the backplate and the substrate in other areas. In the present disclosure, at least one of the substrate or the backplate in the electronic element area has a reduced thickness, thereby increasing light transmittance of the electronic element area. Furthermore, it is not necessary to define a hole to realize an under-display camera lens, so that an area where the camera lens is disposed can display normally, and a screen-to-body ratio is increased. As a result, a technical problem is solved: in conventional OLED display panels, a hole needs to be defined on an area where a camera lens is disposed, leading to a display effect being affected.

It should be noted that FIG. 1 only shows a display area in other areas, but does not show a non-display area in other areas.

In one embodiment, as shown in FIG. 1, a buffer layer 13 is disposed between the substrate 12 and the driving circuit layer 14.

In one embodiment, as shown in FIG. 1, the driving circuit layer 14 includes an active layer 141, a first gate insulating layer 142, a first metal layer 143, a second gate insulating layer 144, a second metal layer 145, an interlayer insulating layer 146, a source/drain layer 147, and a planarization layer 148. A mass fraction of phosphorus in the active layer 141 in the electronic element area 211 is greater than a mass fraction of phosphorus in the active layer 141 in other areas 212. By doping phosphorus into a channel area 311 of the active layer in the electronic element area when forming the active layer, a threshold voltage of a transistor of the driving circuit layer falls to a negative bias voltage which offsets a positive bias voltage of a transistor of the driving circuit layer caused by a following process of removing the substrate and/or the backplate in the electronic element area. Therefore, a thickness of the substrate and/or the backplate in the electronic element area is reduced without causing threshold voltage of the transistor to be positively biased, so that a display effect will not be affected. As a result, a technical problem is solved: threshold voltage of a transistor is positively biased when a thickness of a substrate and a backplate is reduced.

In one embodiment, the active layer 141 includes the channel area 311 and a doped area 312.

In one embodiment, the transistor of the driving circuit layer includes a P-type transistor.

In one embodiment, the OLED display panel includes a plurality of pixel units. A density of the pixel units in the electronic element area is less than a density of the pixel units in other areas. That is, considering a problem of light being blocked by metal layers in the driving circuit layer, an amount of the pixel units is reduced, so that a density of the pixels in the electronic element area is reduced. Therefore, a light transmittance of the electronic element area is increased, and an under-display camera can be realized without defining a hole.

In one embodiment, a thickness of the backplate in the electronic element area is less than a thickness of the backplate in other areas, and a thickness of substrate in the electronic element area is equal to a thickness of the substrate in other areas. Because the backplate has a relatively strong effect on blocking light, the thickness of the backplate in the electronic element area is changed, and the thickness of the substrate remains unchanged. Therefore, light transmittance is increased, light can be transmitted into the electronic elements, and an under-display camera can be realized and can work normally.

In one embodiment, a thickness of the substrate in the electronic element area is less than a thickness of the substrate in other areas, and a thickness of the backplate in the electronic element area is equal to a thickness of the backplate in other areas. When the thickness of the backplate remains unchanged, because the substrate, especially a substrate with high temperature resistance, has a relatively strong effect on blocking light, the substrate is made of yellow polyimide, which causes light to be further blocked by the substrate. Therefore, light cannot effectively reach the electronic elements. In the present embodiment, the thickness of the substrate in the electronic element area is reduced, thereby increasing light transmittance of the electronic element area.

In one embodiment, as shown in FIG. 1, a thickness of the backplate 11 in the electronic element area 211 is less than a thickness of the backplate 11 in other areas 212, and a thickness of the substrate 12 in the electronic element area 211 is less than a thickness of the substrate 12 in other areas 212. To increase light transmittance of the electronic element area, a thickness of the backplate and a thickness of the substrate are reduced at the same time. Therefore, light can effectively pass through the OLED display panel and reach the electronic elements, and light transmittance of the electronic element area is increased. The electronic elements may receive a similar amount of light compared with electronic elements in an OLED display panel with a hole.

In one embodiment, a material of the backplate includes polyethylene terephthalate.

Figure 2:
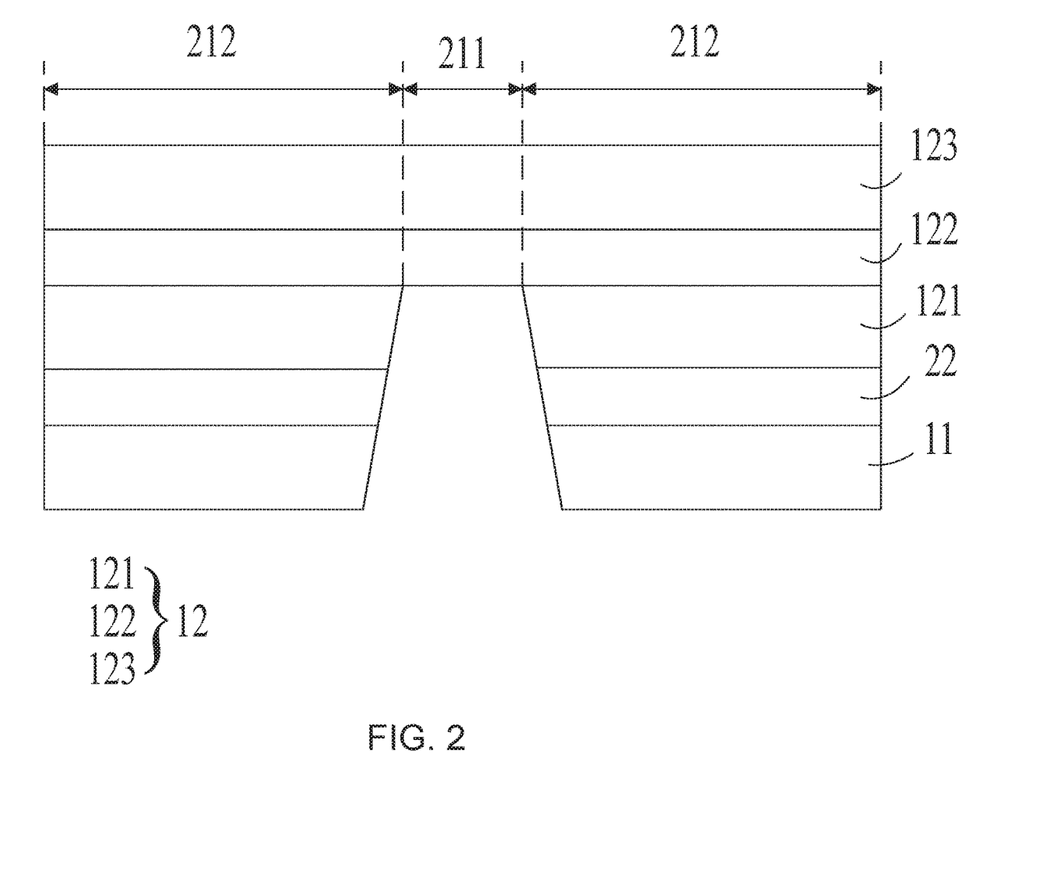
FIG. 2 is a second schematic view showing the OLED display panel provided by an embodiment of the present disclosure.

In one embodiment, as shown in FIG. 2, the substrate 12 includes a first flexible layer 121, a barrier layer 122, and a second flexible layer 123. A thickness of the first flexible layer 121 in the electronic element area 211 is less than a thickness of the first flexible layer 121 in other areas 212. A thickness of the first flexible layer in the electronic element area is reduced. However, because the OLED display panel needs to block moisture and oxygen, thicknesses of the barrier layer and the second flexible layer remain unchanged. Therefore, they can prevent moisture and oxygen from entering the OLED display panel. Furthermore, since the thickness of the first flexible layer is reduced, light transmittance of the electronic element area is increased.

In one embodiment, a material of the first flexible layer is polyimide.

In one embodiment, a material of the second flexible layer is polyimide.

In one embodiment, as shown in FIG. 2, an adhesive layer 22 is disposed between the first flexible layer 121 and the backplate 11. A thickness of the adhesive layer 22 in the electronic element area 211 is less than a thickness of the adhesive layer 122 in other areas 212. When using the adhesive layer to attach the backplate to the substrate, because light transmittance is also be affected by the adhesive layer, the thickness of the adhesive layer in the electronic element area is reduced. Therefore, light transmittance of the electronic element area is increased.

In one embodiment, a material of the adhesive layer includes an optically clear adhesive.

In one embodiment, as shown in FIG. 1, the light-emitting functional layer 15 includes a pixel electrode layer 151, a pixel defining layer 152, a luminescent layer 153, and a common electrode layer 154. A material of the pixel electrode layer and a material of the common electrode layer includes indium tin oxide (ITO). By using ITO to form the pixel electrode layer and the common electrode layer, they may have better light transmittance, and light transmittance of the electronic element area may be increased.

In one embodiment, a thickness of the backplate in the electronic element area is 0. To increase light transmittance of the electronic element area, the backplate in the electronic element area may be removed. Because the electronic element area is relatively small, removing the backplate from such area will not cause other layers to be slipped. Therefore, the OLED display panel can display normally.

In one embodiment, a thickness of the adhesive layer in the electronic element area is 0. To increase light transmittance of the electronic element area. After the backplate in the electronic element area is removed, the adhesive layer in the electronic element area may be removed because it is not necessary to attach the backplate to the substrate. Therefore, light transmittance of the electronic element area can be further increased.

In one embodiment, a thickness of the first flexible layer is 0. The backplate, the adhesive layer, and the first flexible layer in the electronic element area are removed, and the barrier layer and the second flexible layer are retained. Therefore, the barrier layer and the second flexible layer can block moisture and oxygen, and light transmittance of the electronic element area can be increased because the backplate, the adhesive layer, and the first flexible layer are removed.

In one embodiment, as shown in FIG. 2, a shape of an opening formed by the backplate 11, the adhesive layer 22, and the first flexible layer 12 is a trapezoid, thereby allowing light to be diffused on the electronic elements after passing through the first flexible layer. Therefore, the electronic elements can receive sufficient light. Furthermore, a reflector may be disposed on a lateral side of the opening to confine light to the electronic element area, so that the electronic elements can receive sufficient light. Therefore, light transmittance is increased.

Figure 3:
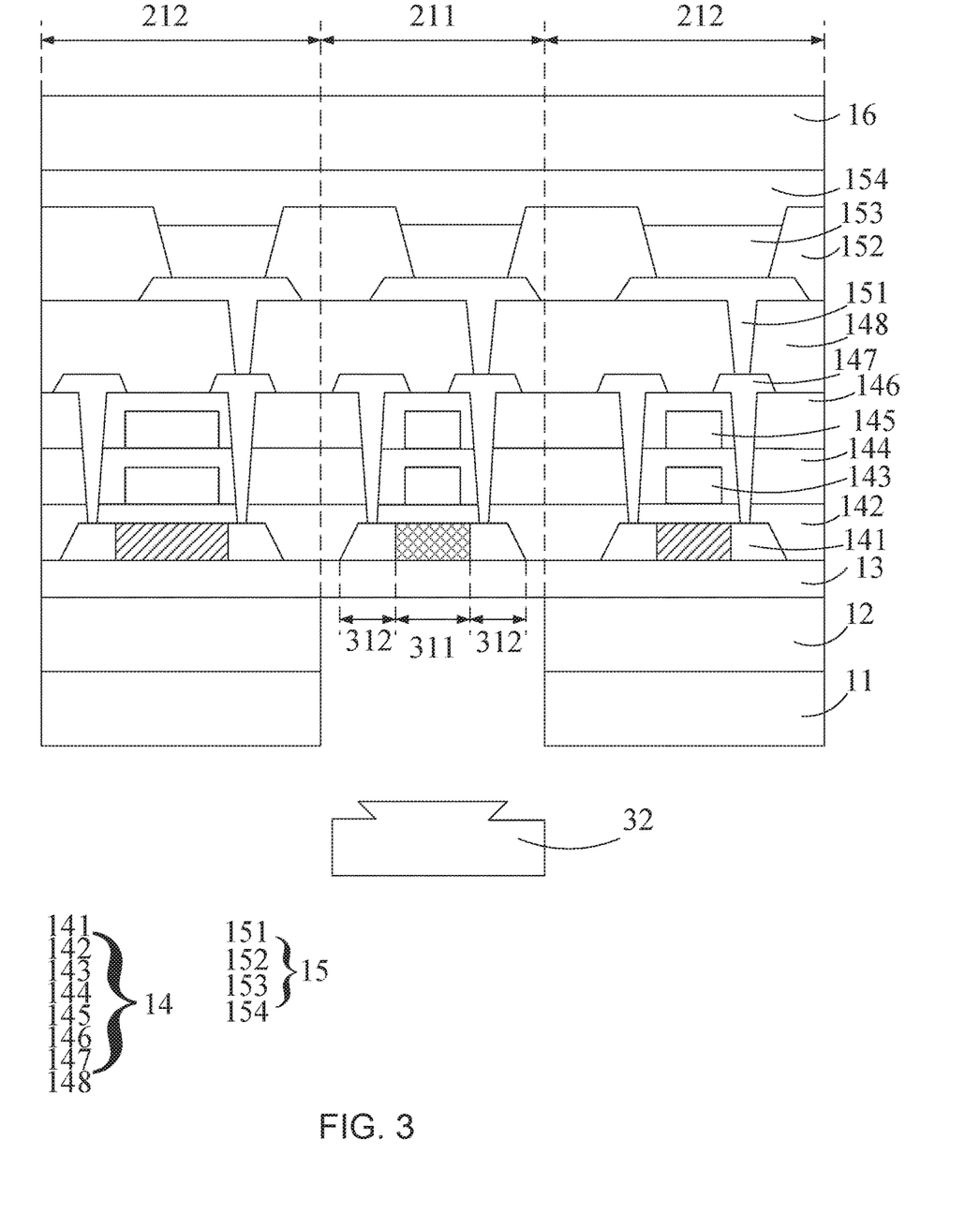
FIG. 3 is a schematic view showing an OLED display device provided by an embodiment of the present disclosure.

As shown in FIG. 3, an embodiment of the present disclosure provides an OLED display device, including: an OLED display panel, wherein the OLED display panel includes a backplate 11, a substrate 12, a driving circuit layer 14, a light-emitting functional layer 15, and an encapsulation layer 16, the substrate 12 is disposed on the backplate 11, the driving circuit layer 14 is disposed on the substrate 12, the light-emitting functional layer 15 is disposed on the driving circuit layer 14, the encapsulation layer 16 is disposed on the light-emitting functional layer 15, and a total thickness of the backplate 11 and the substrate 12 in an electronic element area 211 where a plurality of electronic elements are disposed is less than a total thickness of the backplate 11 and the substrate 12 in other areas; and a plurality of electronic elements 32 disposed in the electronic element area 211.

An embodiment of the present disclosure provides an OLED display device. The OLED display panel includes a backplate, a substrate, a driving circuit layer, a light-emitting functional layer, and an encapsulation layer. The substrate is disposed on the backplate, the driving circuit layer is disposed on the substrate, the light-emitting functional layer is disposed on the driving circuit layer, and the encapsulation layer is disposed on the light-emitting functional layer. A total thickness of the backplate and the substrate in an electronic element area where a plurality of electronic elements are disposed is less than a total thickness of the backplate and the substrate in other areas. In the present disclosure, at least one of the substrate or the backplate in the electronic element area has a reduced thickness, thereby increasing light transmittance of the electronic element area. Furthermore, it is not necessary to define a hole to realize an under-display camera lens, so that an area where the camera lens is disposed can display normally, and a screen-to-body ratio is increased. As a result, a technical problem is solved: in conventional OLED display panels, a hole needs to be defined on an area where a camera lens is disposed, leading to a display effect being affected.

In one embodiment, the electronic elements include a camera lens disposed below the OLED display panel. Traditionally, because an area where the camera lens is disposed receives less light, a hole needs to be defined there. Therefore, light transmittance of the electronic element area is increased, the camera lens can receive more light, and a screen-to-body ratio can be increased without defining a hole.

In one embodiment, in the OLED display device, the driving circuit layer includes an active layer, and a mass fraction of phosphorus in the active layer in the electronic element area is greater than a mass fraction of phosphorus in the active layer in other areas.

In one embodiment, in the OLED display device, the OLED display panel includes a plurality of pixel units, and a density of the pixel units in the electronic element area is less than a density of the pixel units in other areas.

In one embodiment, in the OLED display device, a thickness of the backplate in the electronic element area is less than a thickness of the backplate in other areas, and a thickness of the substrate in the electronic element area is equal to a thickness of the substrate in other areas.

In one embodiment, in the OLED display device, a thickness of the substrate in the electronic element area is less than a thickness of the substrate in other areas, and a thickness of the backplate in the electronic element area is equal to a thickness of the backplate in other areas.

In one embodiment, in the OLED display device, a thickness of the backplate in the electronic element area is less than a thickness of the backplate in other areas, and a thickness of the substrate in the electronic element area is equal to a thickness of the substrate in other areas.

In one embodiment, in the OLED display device, the substrate includes a first flexible layer, a barrier layer, and a second flexible layer, and a thickness of the first flexible layer in the electronic element area is less than a thickness of the first flexible layer in other areas.

In one embodiment, in the OLED display device, an adhesive layer is disposed between the first flexible layer and the backplate, and a thickness of the adhesive layer in the electronic element area is less than a thickness of the adhesive layer in other areas.

Figure 4:
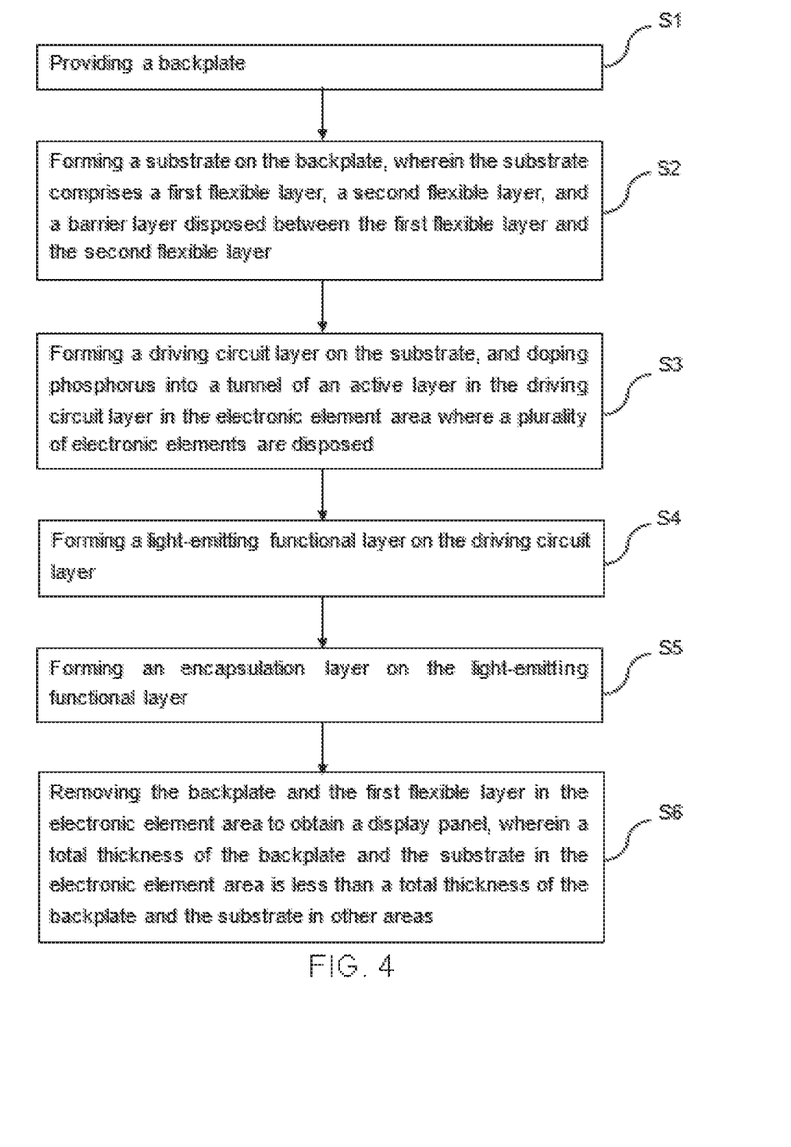
FIG. 4 is a flowchart showing a method of manufacturing an OLED display panel provided by an embodiment of the present disclosure.

As shown in FIG. 4, an embodiment of the present disclosure provides a method of manufacturing an OLED display panel, including following steps:

S1: providing a backplate;

S2: forming a substrate on the backplate, wherein the substrate includes a first flexible layer, a second flexible layer, and a barrier layer disposed between the first flexible layer and the second flexible layer;

S3: forming a driving circuit layer on the substrate, and doping phosphorus into a channel area of an active layer in the driving circuit layer in an electronic element area where a plurality of electronic elements are disposed;

S4: forming a light-emitting functional layer on the driving circuit layer;

S5: forming an encapsulation layer on the light-emitting functional layer; and

S6: removing the backplate and the first flexible layer in the electronic element area to obtain a display panel, wherein a total thickness of the backplate and the substrate in the electronic element area is less than a total thickness of the backplate and the substrate in other areas.

An embodiment of the present disclosure provides a method of manufacturing an OLED display panel. The OLED display panel includes a backplate, a substrate, a driving circuit layer, a light-emitting functional layer, and an encapsulation layer. The substrate is disposed on the backplate, the driving circuit layer is disposed on the substrate, the light-emitting functional layer is disposed on the driving circuit layer, and the encapsulation layer is disposed on the light-emitting functional layer. A total thickness of the backplate and the substrate in an electronic element area where the plurality of electronic elements are disposed is less than a total thickness of the backplate and the substrate in other areas. When manufacturing the OLED display panel, phosphorus is doped in a channel area of the active layer, so that threshold voltage of a transistor in the electronic element area is negatively biased. When removing the backplate and the first flexible layer in the electronic element area, threshold voltage of the transistor in the electronic element is positively biased. Therefore, light transmittance of the electronic element area is increased, threshold voltage of the transistor in the electronic element area is not positively biased, and the OLED display panel can display normally.

In one embodiment, phosphorus, such as phosphine, can be doped into the channel area of the active layer, so that threshold voltage of the transistor in the electronic element area is negatively biased.

In one embodiment, a step of removing the backplate and the first flexible layer includes: removing the backplate and the first flexible layer in the electronic element layer by using a laser.

Figure 5:
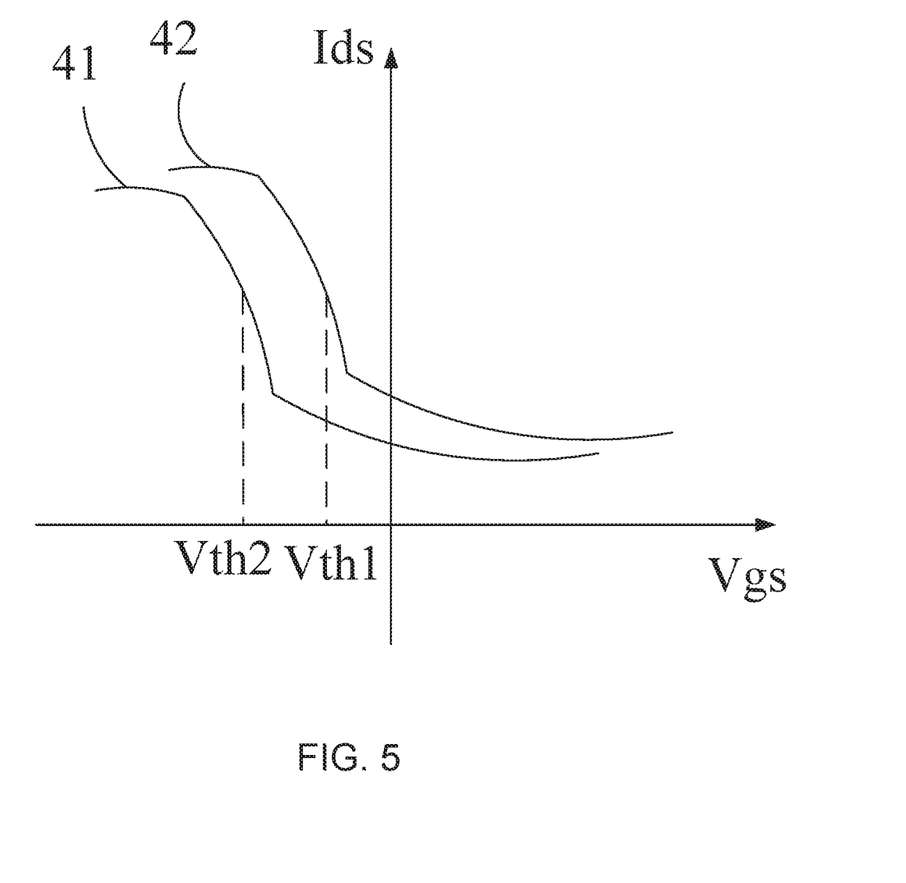
FIG. 5 is a curved diagram showing changes in threshold voltage of a transistor provided by an embodiment of the present disclosure.

In one embodiment, as shown in FIG. 5, the abscissa indicates threshold voltage Vgs of the transistor in the electronic element layer, and the ordinate indicates a leakage current of the transistor in the electronic element layer. After doping phosphorus into the channel area of the active layer in the electronic element area, the threshold voltage of the transistor in the electronic element area will be negatively biased (from curved line 42 to curved line 41). After using a laser to remove the backplate and the first flexible layer, threshold voltage of the transistor in the electronic element area will be positively biased (from curved line 41 to curved line 42). Therefore, light transmittance of the electronic element area can be increased without biasing threshold voltage of the transistor, and the display panel can display normally. Furthermore, a negative bias voltage of the transistor caused by doping the phosphorus and a positive bias voltage of the transistor caused by removing the backplate and the first flexible layer may be equal. For example, after using a laser to remove the backplate and the first flexible layer, a positive shift in threshold voltage of the transistor in the electronic element area is ΔVth. We can control an amount of doped phosphorus to make the threshold voltage of the transistor be based at a negative voltage, that is, the threshold voltage of the transistor is changed from Vth1 to Vth2, and |Vth1−Vth2|=ΔVth. As a result, after being processed, the OLED display panel may have the electronic element area with increased light transmittance. Moreover, a technical problem is solved: removing a backplate and a first flexible layer in OLED display panels will cause threshold voltage of a transistor to be positively biased.

In one embodiment, to solve a problem of a negative shift in threshold voltage of the transistor due to layers being removed, Boron can be doped in advance, so that the threshold voltage of the transistor can be positively biased. Therefore, light transmittance of the electronic element area can be increased without affecting a display function of the OLED display panel.

According to the above embodiments, an OLED display panel, a manufacturing method thereof, and an OLED display device are provided. The OLED display panel includes a backplate, a substrate, a driving circuit layer, a light-emitting functional layer, and an encapsulation layer. The substrate is disposed on the backplate, the driving circuit layer is disposed on the substrate, the light-emitting functional layer is disposed on the driving circuit layer, and the encapsulation layer is disposed on the light-emitting functional layer. A total thickness of the backplate and the substrate in an electronic element area where the plurality of electronic elements are disposed is less than a total thickness of the backplate and the substrate in other areas. In the present disclosure, at least one of the substrate or the backplate in the electronic element area has a reduced thickness, thereby increasing light transmittance of the electronic element area. Furthermore, it is not necessary to define a hole to realize an under-display camera lens, so that an area where the camera lens is disposed can display normally, and a screen-to-body ratio is increased. As a result, a technical problem is solved: in conventional OLED display panels, a hole needs to be defined on an area where a camera lens is disposed, leading to a display effect being affected.

In summary, many changes and modifications to the described embodiment can be carried out by those skilled in the art, and all such changes and modifications are intended to be included within the scope of the appended claims.

What is claimed is:

1. An organic light-emitting diode (OLED) display panel, comprising:
 a backplate;
 a substrate disposed on the backplate;
 a driving circuit layer disposed on the substrate;
 a light-emitting functional layer disposed on the driving circuit layer; and
 an encapsulation layer disposed on the light-emitting functional layer;
 wherein a total thickness of the backplate and the substrate in an electronic element area where a plurality of electronic elements are disposed is less than a total thickness of the backplate and the substrate in other areas; and
 wherein the driving circuit layer comprises an active layer, and a channel area of the active layer located at the electronic element area is doped with phosphorus.

2. The OLED display panel of claim 1, wherein a mass fraction of phosphorus in the active layer in the electronic element area is greater than a mass fraction of phosphorus in the active layer in other areas.

3. The OLED display panel of claim 2, wherein the OLED display panel comprises a plurality of pixel units, and a density of the pixel units in the electronic element area is less than a density of the pixel units in other areas.

4. The OLED display panel of claim 1, wherein a thickness of the backplate in the electronic element area is less than a thickness of the backplate in other areas, and a thickness of the substrate in the electronic element area is equal to a thickness of the substrate in other areas.

5. The OLED display panel of claim 1, wherein a thickness of the substrate in the electronic element area is less than a thickness of the substrate in other areas, and a thickness of the backplate in the electronic element area is equal to a thickness of the backplate in other areas.

6. The OLED display panel of claim 1, wherein a thickness of the backplate in the electronic element area is less than a thickness of the backplate in other areas, and a thickness of the substrate in the electronic element area is less than a thickness of the substrate in other areas.

7. The OLED display panel of claim 6, wherein the substrate comprises a first flexible layer, a barrier layer, and a second flexible layer, and a thickness of the first flexible layer in the electronic element area is less than a thickness of the first flexible layer in other areas.

8. The OLED display panel of claim 7, wherein an adhesive layer is disposed between the first flexible layer and the backplate, and a thickness of the adhesive layer in the electronic element area is less than a thickness of the adhesive layer in other areas.

9. The OLED display panel of claim 8, wherein the thickness of the backplate in the electronic element area is 0.

10. The OLED display panel of claim 8, wherein the thickness of the adhesive layer in the electronic element area is 0.

11. An organic light-emitting diode (OLED) display device, comprising:
 an OLED display panel, wherein the OLED display panel comprises a backplate, a substrate, a driving circuit layer, a light-emitting functional layer, and an encapsulation layer, the substrate is disposed on the backplate, the driving circuit layer is disposed on the substrate, the light-emitting functional layer is disposed on the driving circuit layer, the encapsulation layer is disposed on the light-emitting functional layer, and a total thickness of the backplate and the substrate in an electronic element area where a plurality of electronic elements are disposed is less than a total thickness of the backplate and the substrate in other areas; and a plurality of electronic elements disposed in the electronic element area;
wherein the driving circuit layer comprises an active layer, and a channel area of the active layer located at the electronic element area is doped with phosphorus.

12. The OLED display device of claim 11, wherein the electronic elements comprise a camera lens.

13. The OLED display device of claim 11, wherein a mass fraction of phosphorus in the active layer in the electronic element area is greater than a mass fraction of phosphorus in the active layer in other areas.

14. The OLED display device of claim 13, wherein the OLED display panel comprises a plurality of pixel units, and a density of the pixel units in the electronic element area is less than a density of the pixel units in other areas.

15. The OLED display device of claim 11, a thickness of the backplate in the electronic element area is less than a thickness of the backplate in other areas, and a thickness of the substrate in the electronic element area is equal to a thickness of the substrate in other areas.

16. The OLED display device of claim 11, wherein a thickness of the substrate in the electronic element area is less than a thickness of the substrate in other areas, and a thickness of the backplate in the electronic element area is equal to a thickness of the backplate in other areas.

17. The OLED display device of claim 11, wherein a thickness of the backplate in the electronic element area is less than a thickness of the backplate in other areas, and a thickness of the substrate in the electronic element area is less than a thickness of the substrate in other areas.

18. The OLED display device of claim 17, wherein the substrate comprises a first flexible layer, a barrier layer, and a second flexible layer, and a thickness of the first flexible layer in the electronic element area is less than a thickness of the first flexible layer in other areas.

19. The OLED display device of claim 18, wherein an adhesive layer is disposed between the first flexible layer and the backplate, and a thickness of the adhesive layer in the electronic element area is less than a thickness of the adhesive layer in other areas.

20. A method of manufacturing an organic light-emitting diode (OLED) display panel, comprising following steps:
providing a backplate;
forming a substrate on the backplate, wherein the substrate comprises a first flexible layer, a second flexible layer, and a barrier layer disposed between the first flexible layer and the second flexible layer;
forming a driving circuit layer on the substrate, and doping phosphorus into a channel area of an active layer in the driving circuit layer in an electronic element area where a plurality of electronic elements are disposed;
forming a light-emitting functional layer on the driving circuit layer;
forming an encapsulation layer on the light-emitting functional layer; and
removing the backplate and the first flexible layer in the electronic element area to obtain a display panel, wherein a total thickness of the backplate and the substrate in the electronic element area is less than a total thickness of the backplate and the substrate in other areas.

* * * * *